(12) United States Patent
Clercq et al.

(10) Patent No.: US 11,336,140 B2
(45) Date of Patent: May 17, 2022

(54) COILING PROCEDURE FOR THE STATOR OF AN ELECTRICAL ROTATING MACHINE, AND CORRESPONDING COILED STATOR

(71) Applicant: Valeo Equipements Electriques Moteur, Creteil (FR)

(72) Inventors: Stéphane De Clercq, Étaples-sur-Mer (FR); Geoffrey Wilquin, Étaples-sur-Mer (FR); Sébastien Leclercq, Étaples-sur-Mer (FR)

(73) Assignee: Valeo Equipements Electriques Moteur, Creteil (FR)

( * ) Notice: Subject to any disclaimer, the term of this patent is extended or adjusted under 35 U.S.C. 154(b) by 725 days.

(21) Appl. No.: 16/031,323

(22) Filed: Jul. 10, 2018

(65) Prior Publication Data

US 2019/0020238 A1 Jan. 17, 2019

(30) Foreign Application Priority Data

Jul. 11, 2017 (FR) ...................................... 17/56559

(51) Int. Cl.
*H02K 3/28* (2006.01)
*H02K 3/12* (2006.01)
(Continued)

(52) U.S. Cl.
CPC ................. *H02K 3/28* (2013.01); *H02K 1/12* (2013.01); *H02K 3/12* (2013.01); *H02K 15/085* (2013.01); *H03K 3/30* (2013.01)

(58) Field of Classification Search
CPC .. H02K 3/28; H02K 3/04; H02K 3/12; H02K 3/14; H02K 3/34; H02K 7/183;
(Continued)

(56) References Cited

U.S. PATENT DOCUMENTS

| 2010/0148620 | A1* | 6/2010 | Ishizuka | ................. H02K 3/12 310/201 |
| 2012/0119605 | A1* | 5/2012 | Pflueger | ................. H02K 3/28 310/179 |

(Continued)

FOREIGN PATENT DOCUMENTS

| EP | 0803962 A1 | 10/1997 |
| EP | 0 831 580 A2 | 3/1998 |

(Continued)

*Primary Examiner* — Bryan R Perez
(74) *Attorney, Agent, or Firm* — Osha Bergman Watanabe & Burton

(57) ABSTRACT

The invention mainly concerns a coiling procedure of a stator for a multiphase electrical rotating machine: the said stator comprising grooves, each intended to take up an uneven number of conductors of a coil, the said coil comprising two systems, each comprising one group of conductors (C1-C3, C1'-C3') respectively, the said procedure comprises stages of installation of the conductors (C1-C3, C1'-C3') into the said grooves, repeated in order to form a coil comprising several turns (S1-S9) completed alternately according to a first direction of rotation (K1) and according to a second direction of rotation (K2) opposite the first direction of rotation, with the characteristic that at least two changes of direction of rotation (CH1-CH8) from one turn to the other are carried out in different angular zones.

13 Claims, 7 Drawing Sheets

(51) Int. Cl.
*H02K 15/085* (2006.01)
*H02K 1/12* (2006.01)
*H03K 3/30* (2006.01)

(58) Field of Classification Search
CPC .. H02K 15/085; H02K 15/0478; H02K 1/165; H02K 1/27; H02K 1/24; H02K 21/22; H02K 15/02–0492; H02K 15/024; H02P 21/30; Y10T 29/49009; Y10T 29/49073
See application file for complete search history.

(56) References Cited

U.S. PATENT DOCUMENTS

| | | | |
|---|---|---|---|
| 2015/0028713 A1 | 1/2015 | Rahman et al. | |
| 2015/0054374 A1 | 2/2015 | Neet | |
| 2017/0033619 A1* | 2/2017 | Tamura | H02K 1/16 |

FOREIGN PATENT DOCUMENTS

| | | |
|---|---|---|
| EP | 2101397 A2 | 9/2009 |
| FR | 3033456 A1 | 9/2016 |
| WO | 16139430 A1 | 9/2016 |

* cited by examiner

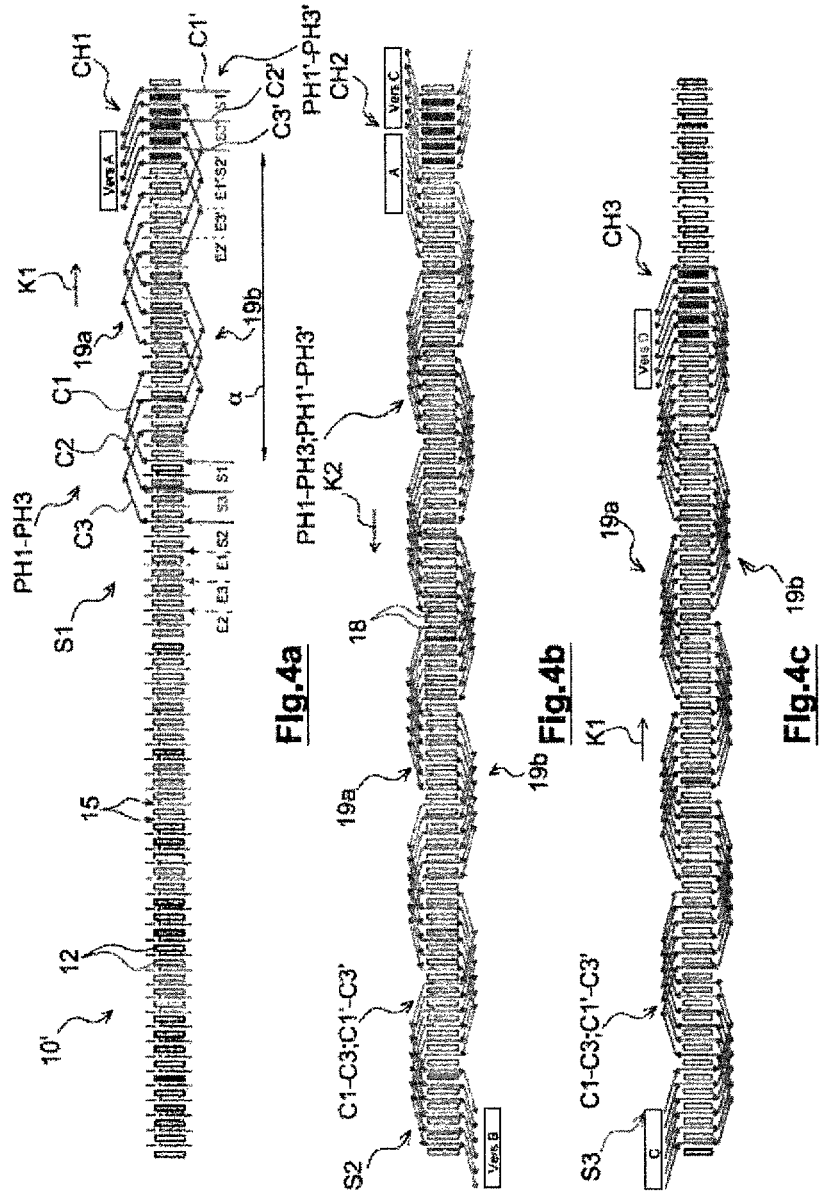

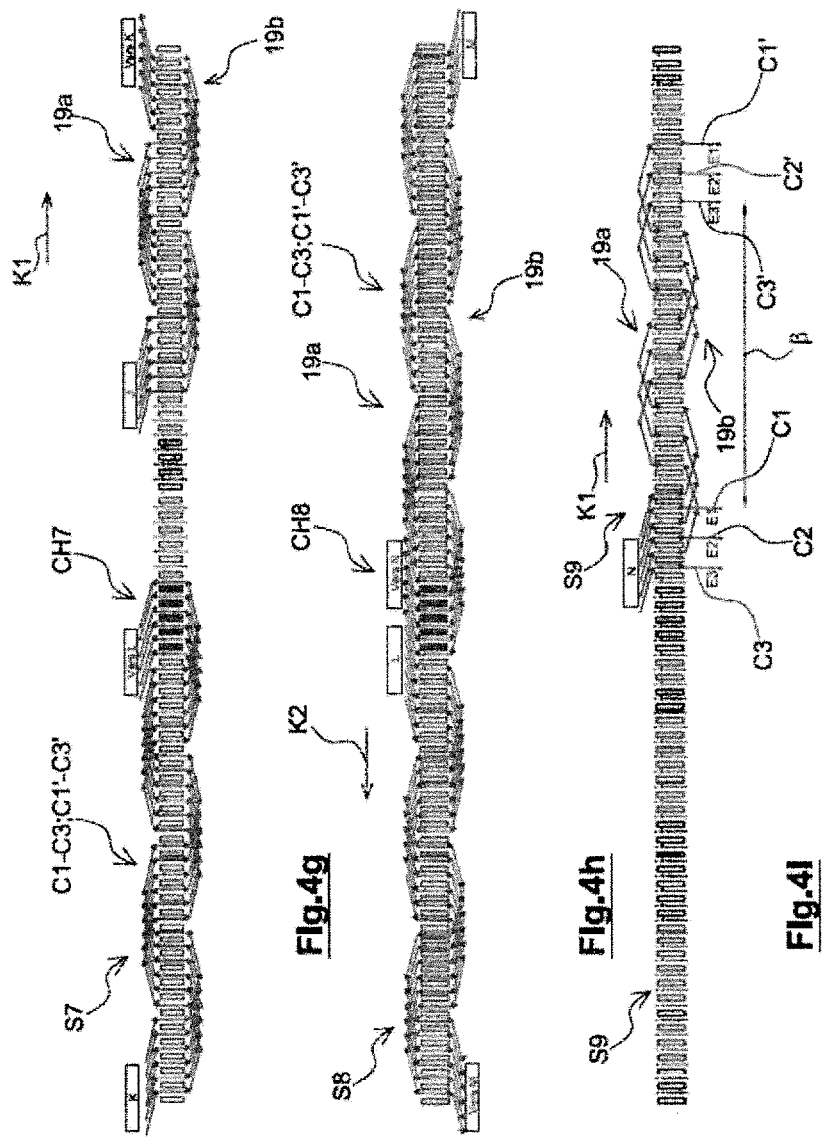

COILING PROCEDURE FOR THE STATOR OF AN ELECTRICAL ROTATING MACHINE, AND CORRESPONDING COILED STATOR

The present invention concerns an improved coiling procedure of a stator for an electrical rotating machine, as well as the corresponding coiled stator. The invention is particularly advantageously applied to a stator of an electrical rotating machine such as, for example, an alternator, a starter-alternator, or an electric motor.

As is well known, electrical rotating machines comprise a stator and a rotor connected to a shaft. The rotor may be connected to a master and/or slave shaft, and may belong to an electrical rotating machine in the form of an alternator as described in document EP0803962, or an electric motor as described in document EP0831580. The electrical machine comprises a casing that houses the stator. This casing is also configured to make the shaft of the rotor rotate, by the intermediary of bearings for example.

The rotor comprises a body that consists of a stack of metal sheets held in the form of a pack by means of an appropriate fixation system, such as rivets that cross straight through the rotor axially. The rotor comprises poles that consist, for example, of permanent magnets set within cavities arranged within the magnetic mass of the rotor, as described in document EP0803962, for example. Alternatively, in a design with so-called "protruding" poles, the poles consist of coils wound around the arm of the rotor.

The stator comprises a body that consists of a stack of thin metal sheets together with a phase coiling than runs into grooves of the stator that are opened inwards. In stators of alternators of this kind, the most commonly used types of coils are, on the one hand, so-called "concentric" coils that consist of coils that are closed onto themselves and wound around the teeth of the stator, and on the other hand, the so-called "corrugated" type of coils.

A corrugated coil comprises several phase windings, and each phase winding comprises a spiral conductor, each turn of which forms corrugations that run through the grooves of the body. Thus, in each turn, the conductor presents loop structures situated alternately on either side of the stator, linking segment structures between them, situated inside the grooves of the stator. The conductor may consist of one or more electricity conductive wires.

Document FR3033456 indicates the implementation of a coiling procedure in which the injection of the three-phase systems in the first turn, and the stoppage of the coiling of the three-phase systems in the last turn, are staggered in such a way as to respect the position of the phase entrances and exits in relation to the positioning of the electronic controls of the electrical rotating machine.

As illustrated in FIG. 1, the inversion of direction of rotation CH from one turn S1-S8 to the other takes place at the same angular position of the stator. However, for stators that have an uneven number of conductors per groove, there are over-thicknesses on the leading-out wire between the 2 systems of phases. For a stator of n turns, the leading-out wire will have visible layers of (n−1)/2 turns and [((n+1)/2)+1] turns. Thus, as illustrated on FIG. 2, for a stator comprising 7 conductors per groove, one observes, between the 2 systems of phases, zones Z1 with three layers of turns and zones Z2 with five layers of turns, which entails a significant requirement of space.

The invention serves to efficiently remedy this drawback by proposing a coiling procedure of a stator for a multiphase electrical rotating machine:

the said stator comprising grooves intended to each take up an uneven number of conductors of a coil, the said coil comprising two systems, each comprising one group of conductors respectively, the said procedure comprises stages of installation of the conductors into the said grooves, repeated in order to form a coil comprising several turns, completed alternately according to a first direction of rotation, and according to a second direction of rotation opposite the first direction of rotation, with the characteristic that at least two changes of direction of rotation from one turn to the other take place in different angular zones.

The invention thus makes it possible, by inverting the coiling rotation in order to distribute it in an unconventional way, to obtain coiling leading-out wires of homogenous thickness. In this case, for a stator having an uneven number n of conductors per groove, the leading-out wire will have visible layers of (n+1)/2 turns between the two systems of phases.

According to one implementation, certain turns, particularly uneven turns, situated between a first turn and a last turn, are spread over less than 360 degrees.

According to one implementation, certain turns, particularly even turns, situated between a first turn and a last turn, are spread over 360 degrees.

According to one implementation, the said procedure comprises a completion stage of a first turn in which the start of installation of the conductors of the second system is staggered in relation to the start of installation of the conductors of the first system.

According to one implementation, the angular displacement between the start of installation of the conductors of the second system and the start of installation of the conductors of the first system depends on a positioning of electronic controls.

According to one implementation, the said procedure comprises a completed stage of a last turn in which the stoppage of installation of the conductors of the second system is staggered in relation to the stoppage of installation of the conductors of the first system.

According to one implementation, the angular displacement between the stoppage of installation of the conductors of the second system and the stoppage of installation of the conductors of the first three-phase system depends on a positioning of electronic controls.

According to one implementation, the conductors of the first system and the conductors of the second system are first of all coiled onto a pin, and then transferred onto a stator body. However, as a variant, it is possible to coil directly into the body of the stator.

According to one implementation, the first system and the second system are of three-phase type.

According to one implementation, each conductor consists of one or more electricity conductive wires, particularly two wires.

The invention likewise has as its object a stator for a multiphase electrical rotating machine comprising grooves intended to each take up an uneven number of conductors of a coil:

the said coil comprising two systems, each comprising one group of conductors respectively, the said coil comprising several turns, completed alternately according to a first direction of rotation, and then according to a second direction of rotation opposite the first direction of rotation, with the characteristic that at least two changes of direction of rotation from one turn to the other are situated in different angular zones.

The invention will be better understood by reading the following description and examining its accompanying figures. These figures are given for illustration purposes only, and they do not limit the invention in any way.

FIG. 1, already described, is a representation of the angular positioning of the different changes of direction of rotation for the completion of turns while implementing a classical coiling procedure with an even number of conductors per groove;

FIG. 2, already described, is an aerial view of a stator, illustrating the configuration of the leading-out wires for a coil that has an uneven number of conductors per groove, obtained by a classical coiling procedure;

FIG. 3 is a perspective view of a coiled stator obtained after the implementation of the coiling procedure according to the present invention;

FIGS. 4a to 4i, for a pin represented in flat projection, illustrate the different turns completed during the implementation of the coiling procedure according to the present invention;

Identical, similar or analogous elements retain the same reference from one figure to the other.

Figure 1:
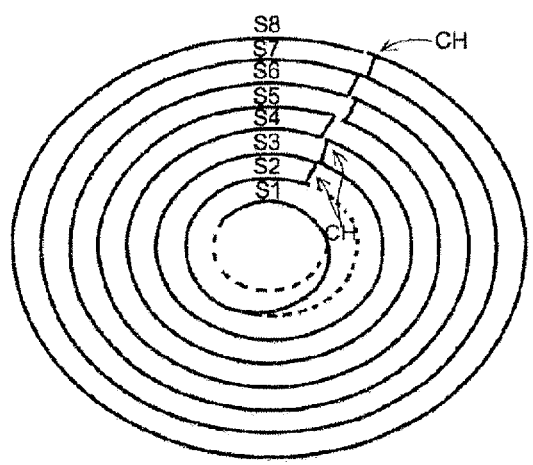
Figure 2:
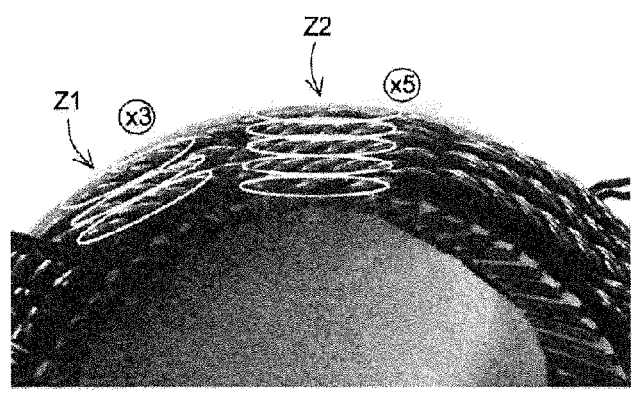
Figure 3:
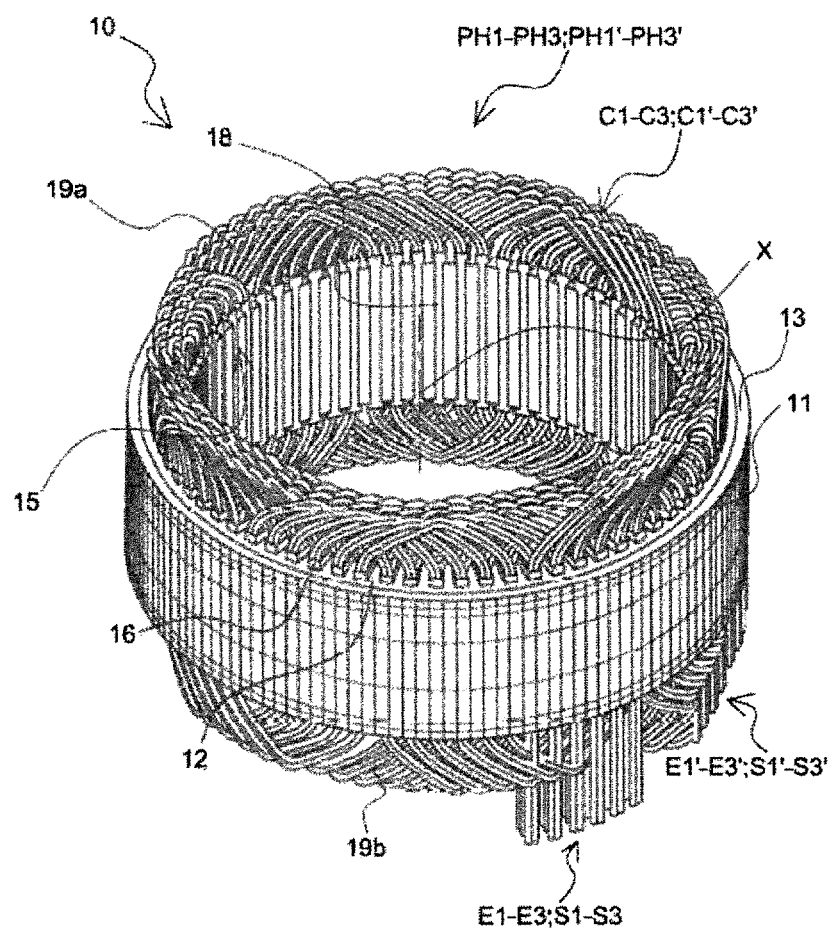

FIG. 3 is a perspective view of a coiled stator 10 of an electrical rotating machine which comprises mainly a body 11 in which several phase windings PH1-PH3; PH1'-PH3' are fitted, forming a coil. For example, the electrical machine is an alternator or a starter-alternator. This electrical machine is preferably intended to be implemented in a motor vehicle. One recalls that a starter-alternator is an electrical machine designed, on the one hand, to function in reverse as an electricity generator in alternator function, and on the other hand as an electric motor, particularly to start the thermal engine of the motor vehicle.

The body of stator 11 is of annular cylindrical shape with an X axis, and consists of an axial stack of flat metal sheets. Body 11 comprises teeth 12, distributed regularly at angles over an internal circumference of a cylinder head 13. These teeth 12 mark out grooves 15, two by two. The cylinder head 13 corresponds to the full annular portion of body 11, which extends between the bottom of the grooves 15 and the outer periphery of body 11.

The grooves 15 open axially onto either side of body 11. The grooves 15 are likewise opened radially on the inside of body 11. The grooves 15 preferably have parallel edges, that is, the interior sides are parallel to each other. For example, the grooves 15 are 36, 48, 60, 72, 84, or 96 in number. In the example of completion, stator 10 comprises 72 grooves. Stator 10 preferably comprises tooth roots, so that the grooves can be closed with the aid of wedges that the tooth roots hold in place radially. Insulating materials 16 are arranged in the grooves 15 of the stator.

In order to form the coil of stator 10, several phase windings PH1-PH3, PH1'-PH3' are installed in the grooves 15 of body 11. In this case, the "hexaphase" stator comprises six phase windings in order to form two three-phase systems coupled together. However, the invention is applicable to stators comprising a larger number of their three-phase systems, or to systems that each comprise a number of phase windings other than three.

Each phase winding PH1-PH3, PH1'-PH3' consists of a conductor C1-C3, C1'-C3' folded in a meandering shape and wound inside the stator in the grooves 15 in order to form turns, and the winding of several turns completes the coil of the complete phase. One turn corresponds to the portion of the coil between two changes of direction of rotation, or to the portion between the phase entrances and the first change of direction of rotation, or to the portion between the last change of direction of rotation and the phase exits.

Each groove 15 takes up the conductor C1-C3, C1'-C3' of the same phase several times, so whenever there are N phase windings, the conductor of the same phase winding PH1-PH3, PH1'-PH3' is inserted in all the N grooves 15.

In each turn, the conductor C1-C3, C1'-C3' presents loop structures 19a, 19b situated alternately on either side of the stator, connecting between them segment structures 18 situated in a series of grooves 15 associated with a given phase winding. It should be noted that each conductor C1-C3, C1'-C3' may comprise a bundle of M conductor wires, M being preferably at least 2. As a variant, each conductor C1-C3, C1'-C3' consists of a single wire. In this case, the wires are of round section. Alternatively, in order to optimise the filling of the grooves 15, the wires may be of a rectangular or square section. The conductors are preferably made of enamel-coated copper.

With reference to FIGS. 4a to 4i, a description follows of the procedure that makes it possible to obtain the coiled hexaphase stator 10 comprising a first three-phase system formed by phase windings PH1-PH3, and a second three-phase system formed by the windings PH1'-PH3'. Each phase winding PH1-PH3, PH1'-PH3' consists of a corresponding coiled conductor C1-C3, C1'-C3'. In this case, the conductors C1-C3, C1'-C3' each comprise a bundle of 2 wires, even though just one wire per conductor has been represented on the figures in order to facilitate understanding of the procedure.

To be precise, as illustrated on FIG. 4a, a first installation stage of the conductors C1-C3 of the first system takes place, in order to form a first (so-called starter) turn S1. Accordingly, the conductors C1-C3 are inserted into three separate grooves 15 corresponding to the first system A. Two adjacent grooves 15 of this assembly are spaced between each other by one groove, which is left free in order to allow the subsequent insertion of the conductors C1'-C3' of the second three-phase system B, as explained below.

For example, the ends of the conductors C1-C3 of the starter turn correspond to the exits S1-S3 of the coil of the first system.

The conductors C1-C3 of the first system are then folded in order to form loop structures 19a, of significantly triangular shape here, which overhang stator 10 on the same side. The conductors C1-C3 of the first system A are then each inserted into the next groove 15 which is situated N grooves after the first (here, N=6). The conductors C1-C3 are then folded in order to form loop structures 19b that overhang on a side opposite that of the first loop structures 19a. Thus, the loop structures 19a, 19b are situated outside stator 10 alternately on either side of the stator, and all of the loop structures 19a, 19b overhang stator 10 on the same side, forming a leading-out wire of coiling.

One thus goes on to form the coil of only the first system PH1-PH3, until a number of grooves corresponding to a predetermined angle α of the stator 10 is covered. This angle α is pre-determined in such a way that the exits of the two three-phase systems are situated opposite the corresponding electronic controls respectively.

Once this pre-determined angle α is achieved, for example an angle α in the order of 120 degrees, the installation of conductors C1'-C3' of the second three-phase system is completed. Accordingly, the portions of conductors C1'-C3' of the second system, corresponding for example to exits S1'-S3', are inserted into the free grooves 15 situated between the grooves filled by the first system A, as well as in an adjacent groove 15, in order to alternately have one groove 15 that takes up a conductor of one of the PH1-PH3 systems, then one groove 15 that takes up a conductor of the other PH1'-PH3' system.

The simultaneous coiling of the two three-phase systems is then completed. In other words, the coiling is carried out simultaneously and parallel to N conductors C1-C3, C1'-C3' in successive series of N grooves 15 (N here being equal to 6).

The coil of the starter turn S1 having been completed in a first direction K1, one carries out a change of direction CH1 in order to proceed in a second direction of coiling K2 in order to complete a second turn S2, as illustrated on FIG. 4b. The two systems are then coiled simultaneously in the turn S2 following one turn, that is, all the grooves 15 of the pin are successively filled per serie of N grooves by the two systems according to the direction K2.

Upon termination of the second turn S2, one carries out a change of direction CH2 in order to retrace the direction of coiling K1 in order to complete a third turn S3, as illustrated on FIG. 4c. The two systems are then coiled simultaneously in the turn S3, following less than one complete turn of stator 10, that is, less than 360 degrees (see FIG. 4c).

It should be noted that during a coiling phase in the opposite direction, each loop structure 19a, 19b of a conductor C1-C3, C1'-C3' belonging to a given winding PH1-PH3, PH1'-PH3' is to be placed in the free space between two loop structures 19a, 19b of the conductors C1-C3, C1'-C3' obtained during the phase of coiling in the first direction. One thus achieves a distributed, corrugated symmetrical coil.

Figure 4D:
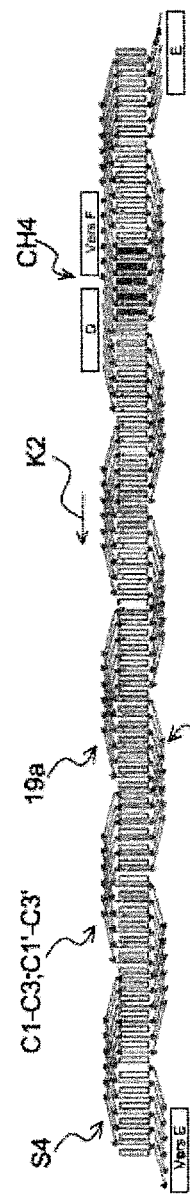
Figure 4E:
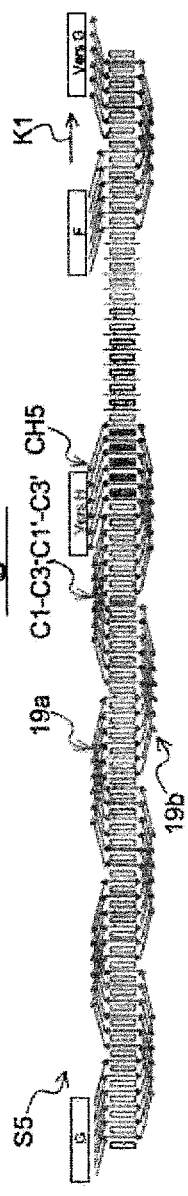
Figure 4F:
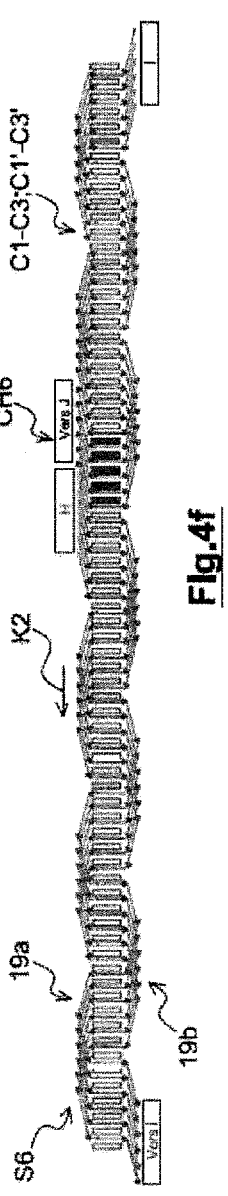

Upon completion of the third turn S3, a further change of direction CH3 takes place in order to complete a fourth turn S4, as shown in FIG. 4d. The stages are repeated in order to complete turns S5 to S8 with the corresponding changes of direction of rotation CH5 to CH8 (see FIGS. 4e to 4h).

The uneven turns S3, S5, S7 situated between the first turn S1 and the last turn S9 are spread over less than 360 degrees, while the even turns S2, S4, S6, S8 situated between the first turn S1 and the last turn S9 are spread over 360 degrees.

s After having completed a last change of direction CH8, a last turn S9 is completed, as illustrated on FIG. 4i, in which the stoppage of installation of the conductors C1-C3 of the first three-phase system is staggered in relation to the stoppage of installation of the conductors C1'-C3' of the second three-phase system. For example, the ends of the conductors C1-C3, C1'-C3' of the last turn S9 correspond to the entrances E1-E3 of the coil of the first system PH1-PH3, and to the E1'-E3' entrances of the coil of the second system PH1'-PH3', respectively. Advantageously, the angular displacement β between the stoppage of installation of the conductors C1'-C3' of the second system and the stoppage of installation of the conductors C1-C3 of the first three-phase system depends on the positioning of the electronic controls. In fact, this angular displacement β is predetermined in such a way that the entrances of the two three-phase systems are situated opposite the corresponding electronic controls respectively. For example, this angular displacement β is of 120 degrees.

As illustrated on FIGS. 4a-4i, 6 and 8, at least two changes of direction of rotation CH1-CH8 from one turn to the other are carried out in different angular zones. The term "different angular zones" signifies the fact that all the conductors C1-C3, C1'-C3' of one zone of change of direction of rotation are situated in grooves 15, which differ from the grooves of another zone of change of direction of rotation. Therefore, there is no overlap between the grooves 15 of the two different angular zones of changes of direction of rotation.

Figure 6:
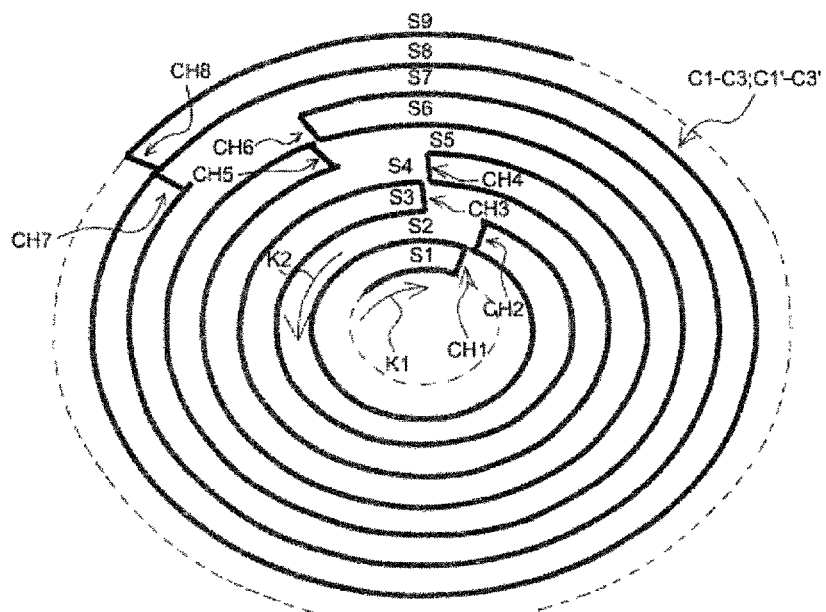
FIG. 6 is a diagram representation of the angular positioning of the different changes of direction of rotation of the turns when implementing a coiling procedure according to the invention.

In the example of completion of FIG. 6, the changes of direction of coiling rotation CH1 and CH2 take place in a first angular zone. The changes of direction of coiling rotation CH3 and CH4 are situated in a second angular zone. The changes of direction of coiling rotation CH5 and CH6 are situated in a third angular zone. The changes of direction of coiling rotation CH7 and CH8 are situated in a fourth angular zone.

These four angular zones differ from each other. Two adjacent angular zones are spaced between them at an angle of less than 180 degrees.

Figure 8:
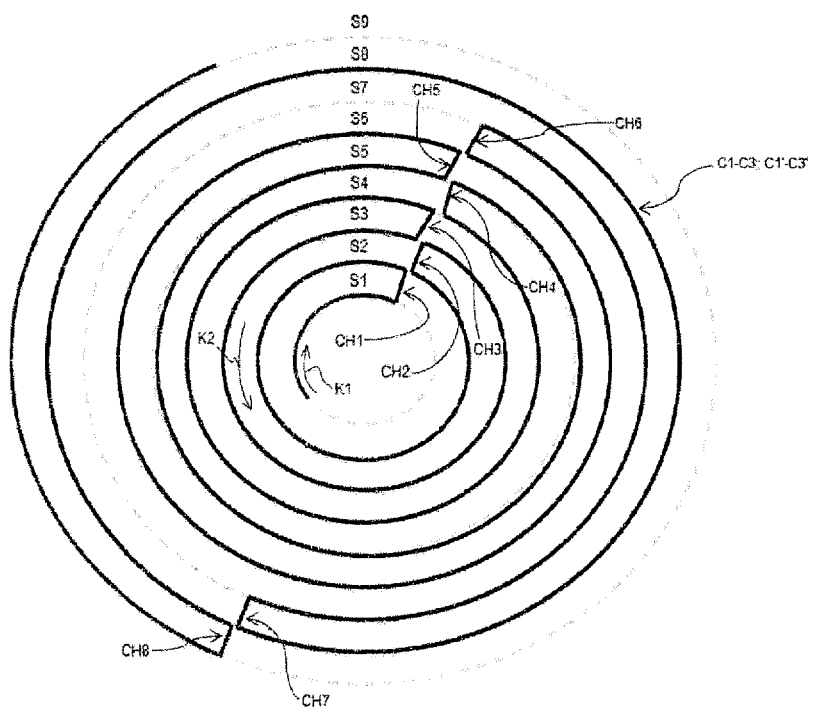
FIG. 8 is a diagram representation of the angular positioning of the different changes of direction of rotation of the turns at the time of a variant of implementation of the coiling procedure according to the invention.

In the example of completion of FIG. 8, the changes of direction of coiling rotation CH1 to CH6 take place in a first angular zone, while the changes of coiling direction CH7 and CH8 rotation are situated in a second angular zone that differs from the first angular zone. These two angular zones are spaced between them at an angle in the order of 180 degrees.

Figure 7:
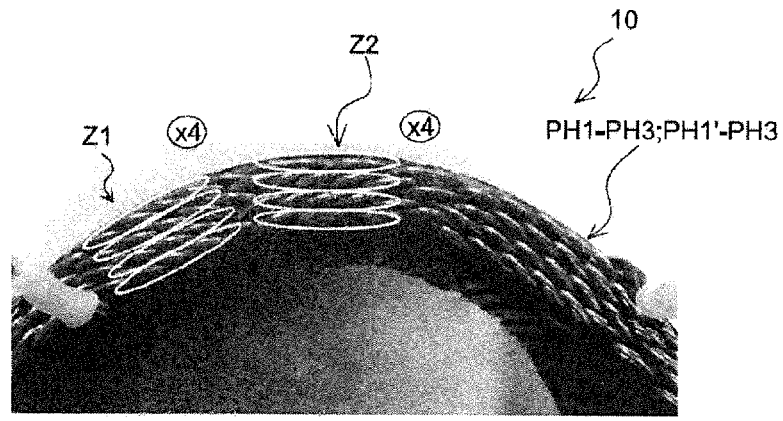
FIG. 7 is an aerial view of a stator, illustrating the configuration of the leading-out wires for a coil that has an uneven number of turns, obtained with the coiling procedure according to the invention.

As illustrated on FIG. 7, the invention thus makes it possible, by inverting to the coiling rotation in order to distribute it in an unconventional way, to obtain leading-out wires of coiling of homogenous thickness. In this case, for a stator that has an uneven number n of turns, the leading-out wire will have visible layers of (n+1)/2 turns between the two phase systems. For a stator comprising 7 conductors per groove, there are therefore 4 visible layers in zones Z1 and Z2, on average.

Figure 5:
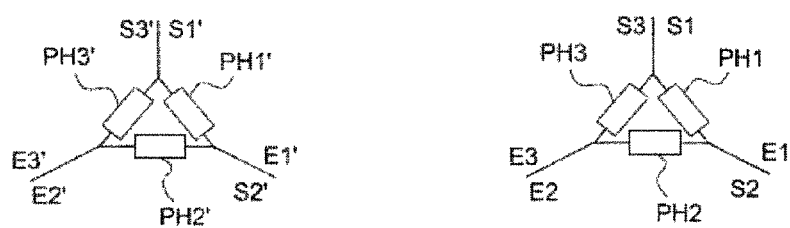
FIG. 5 illustrates the coupling of the two three-phase systems obtained after the implementation of the procedure according to the present invention.

At the end of the procedure, the entrances E1-E3, E1'-E3' and the exits S1-S3, S1'-S3' of each system are re-grouped between them in the same angular sector, so that it is possible to easily complete a triangular coupling of each of the three-phase systems, as shown in FIG. 5.

Accordingly, in the first system PH1-PH3, the entrance E1 of the first phase winding PH1 is connected to the exit S2 of the second phase winding PH2, the exit S1 of the first phase winding PH1 is connected to the exit S3 of the third phase winding PH3, and the entrance E2 of the second phase winding PH2 is connected to the entrance E3 of the third phase winding PH3.

Elsewhere, in the second system PH1'-PH3', the entrance E1' of the first phase winding PH1' is connected to the exit S2' of the second phase winding PH2', the exit S1' of the first phase winding PH1' is connected to the exit S3' of the third phase winding PH3', and the entrance E2' of the second phase winding PH2' is connected to the entrance E3' of the third phase winding PH3'.

Advantageously, the conductors C1-C3, C1'-C3' of the first system PH1-PH3 and of the second system PH1'-PH3' are first of all coiled onto a pin 10', and then transferred to the stator body 11. As a variant, the coil may be completed in situ directly on the stator body 11.

As a variant, the three-phase systems PH1-PH3; PH1'-PH3' may be coupled in a star-shaped configuration.

Of course, the above description was given by way of example only, and does not limit the scope of the invention, which would not be compromised by replacing the different elements or stages with any other equivalent ones.

The invention claimed is:

1. A method for coiling of a stator for a multiphase electrical rotating machine,
   wherein the stator comprises grooves each intended to take up an uneven number of conductors of a coil, the coil comprising two systems each comprising one group of conductors respectively, and
   wherein the method comprises:
      repeating stages of installation of the conductors into the grooves, so as to form a coil comprising several turns completed tangentially alternating according to a first rotational direction and according to a second rotational direction opposite the first rotational direction,
      wherein at least two changes of rotational direction from one turn to the other are carried out in different angular zones.

2. The method according to claim 1, further comprising:
   performing a completion stage of a first turn in which a start of installation of the conductors of the second system is staggered in relation to a start of installation of the conductors of the first system.

3. The method according to claim 2, wherein an angular displacement between the start of installation of the conductors of the second system and the start of installation of the conductors of the first system depends on a positioning of electronic controls.

4. The method according to claim 1,
   wherein repeating the stages of installation of the conductors in the grooves is performed to obtain:
      a first change of rotational direction in first angular zone,
      a second change of rotational direction in a second angular zone,
      a third change of rotational direction in a third angular zone, and
      a fourth change of rotational direction in fourth second angular zone,
      wherein the first, second, third and fourth angular zones are distinct from one another.

5. The method according to claim 4,
   wherein the first, second, third and fourth angular zones are comprised in an interval of less than 180°.

6. The method according to claim 1, wherein uneven turns situated between a first turn and a last turn are spread over less than 360 degrees.

7. The method according to claim 1, wherein even turns situated between a first turn and a last turn are spread over 360 degrees.

8. The method according to claim 1, further comprising:
   performing a completion stage of a last turn in which a stoppage of installation of the conductors of the second system is staggered in relation to a stoppage of installation of the conductors of the first system.

9. The method according to claim 1, wherein the conductors of the first system and the conductors of the second system are all first coiled onto a pin, and then transferred to a stator body.

10. The method according to claim 1, herein the first system and the second system are of three-phase type.

11. The method according to claim 1, wherein each conductor consists of one or more electricity conductive wires.

12. A stator for a multiphase electrical rotating machine comprising grooves, each intended to take up an uneven number of conductors of a coil:
    the coil comprising:
       two systems each comprising one group of conductors respectively,
       several turns completed tangentially alternating according to a first rotational direction, then according to a second rotational direction opposite the first rotational direction,
       wherein at least two changes of rotational direction from one turn to the other are situated in different angular zones.

13. A method for coiling of a stator for a multiphase electrical rotating machine,
    wherein the stator comprises grooves each intended to take up an uneven number of conductors of a coil, the coil comprising two systems each comprising one group of conductors respectively, and
    wherein the method comprises:
       repeating stages of installation of the conductors into the grooves, so as to form a coil comprising several turns completed tangentially alternating according to a first rotational direction and according to a second rotational direction opposite the first rotational direction,
       wherein at least two changes of rotational direction from one turn to the other are carried out in different angular zones, and
       wherein each of the at least two changes of the rotational direction is in a tangential direction of the stator.

* * * * *